United States Patent
Petrzelka

(10) Patent No.: US 9,149,958 B2
(45) Date of Patent: Oct. 6, 2015

(54) STAMP FOR MICROCONTACT PRINTING

(71) Applicant: Massachusetts Institute of Technology, Cambridge, MA (US)

(72) Inventor: Joseph Edward Petrzelka, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/661,126

(22) Filed: Oct. 26, 2012

(65) Prior Publication Data

US 2013/0122135 A1  May 16, 2013

Related U.S. Application Data

(60) Provisional application No. 61/559,203, filed on Nov. 14, 2011.

(51) Int. Cl.
| | |
|---|---|
| *B29C 33/42* | (2006.01) |
| *G03F 7/00* | (2006.01) |
| *B82Y 10/00* | (2011.01) |
| *B82Y 40/00* | (2011.01) |

(52) U.S. Cl.
CPC ............ *B29C 33/424* (2013.01); *B82Y 10/00* (2013.01); *B82Y 40/00* (2013.01); *G03F 7/0002* (2013.01); *G03F 7/0017* (2013.01)

(58) Field of Classification Search
CPC ............ B29C 33/3842; B29C 33/3857; B29C 33/424; B82Y 40/00; B82Y 10/00; G03F 7/0002; G03F 7/0017
USPC ................ 425/385, 174.4, 470, 195, 383, 425/395–396; 264/293, 219, 220, 225, 2.5
See application file for complete search history.

(56) References Cited

U.S. PATENT DOCUMENTS

| | | | |
|---|---|---|---|
| 4,432,716 A * | 2/1984 | Kiss | 425/89 |
| 5,814,355 A * | 9/1998 | Shusta et al. | 425/373 |
| 6,166,856 A * | 12/2000 | Araki et al. | 359/627 |
| 6,656,308 B2 | 12/2003 | Hougham | |
| 6,736,985 B1 | 5/2004 | Bao | |
| 6,783,717 B2 | 8/2004 | Hougham | |
| 6,805,966 B1 * | 10/2004 | Formato et al. | 428/457 |

(Continued)

FOREIGN PATENT DOCUMENTS

| | | |
|---|---|---|
| KR | 2010/0055023 A | 5/2010 |
| WO | 2006/117745 A2 | 11/2006 |
| WO | 2009/158631 A1 | 12/2009 |

OTHER PUBLICATIONS

Xia Y., and Whitesides G. M., 1998, "Soft Lithography." Angewandte Chemie International Edition, 37(5),pp. 550-575.

Kumar A., Biebuyck H. A., and Whitesides G. M., 1994, "Patterning Self-Assembled Monolayers: Applications in Materials Science," Langmuir, (10), pp. 1498-1511.

Kumar A., Biebuyck H., Abbott N., and Whitesides G. M., 1992, "The use of self-assembled monolayers and a selective etch to generate patterned gold features," Journal of the American Chemical Society, 114, pp. 9188-9189.

(Continued)

*Primary Examiner* — Nahida Sultana
(74) *Attorney, Agent, or Firm* — Sam Pasternack; MIT Technology Licensing Office

(57) ABSTRACT

Stamp for microcontact printing. The stamp includes a bulk portion having first and second surfaces, the first surface including a pattern of features to be transferred and the second surface including a different pattern of features. The features on the second surface have a lower stiffness than the features on the first surface. The dual-face stamp design of the invention provides an alternative location for dimensional errors to be absorbed, making microcontact printing a more robust production process.

6 Claims, 1 Drawing Sheet

(56) References Cited

U.S. PATENT DOCUMENTS

| | | | |
|---|---|---|---|
| 6,981,445 B2 | 1/2006 | Cracauer | |
| 7,117,790 B2 | 10/2006 | Kendale | |
| 7,179,079 B2 * | 2/2007 | Sreenivasan et al. | 425/385 |
| 8,261,660 B2 * | 9/2012 | Menard | 101/32 |
| 8,506,867 B2 * | 8/2013 | Menard | 264/293 |
| 2004/0061248 A1 * | 4/2004 | Chan et al. | 264/2.5 |
| 2004/0191700 A1 | 9/2004 | Kuwabara | |
| 2005/0023145 A1 * | 2/2005 | Cohen et al. | 205/118 |
| 2005/0093186 A1 * | 5/2005 | Nystrom et al. | 264/1.36 |
| 2005/0253296 A1 * | 11/2005 | Landis et al. | 264/219 |
| 2006/0131768 A1 * | 6/2006 | Chiba | 264/1.32 |
| 2007/0102842 A1 * | 5/2007 | Naniwa et al. | 264/219 |
| 2007/0126136 A1 * | 6/2007 | Fujita et al. | 264/2.5 |
| 2008/0000375 A1 * | 1/2008 | Nielsen et al. | 101/450.1 |
| 2008/0084006 A1 * | 4/2008 | Gao et al. | 264/293 |
| 2008/0229948 A1 | 9/2008 | Washiya | |
| 2009/0140458 A1 * | 6/2009 | Xu et al. | 264/293 |
| 2009/0212011 A1 * | 8/2009 | Abe et al. | 216/52 |
| 2009/0224417 A1 * | 9/2009 | Lawton et al. | 264/2.5 |
| 2009/0226766 A1 * | 9/2009 | Moribe et al. | 428/848 |
| 2010/0108639 A1 * | 5/2010 | Kasono | 216/41 |
| 2010/0123268 A1 * | 5/2010 | Menard | 264/293 |
| 2010/0227018 A1 * | 9/2010 | Landis | 425/470 |
| 2010/0247698 A1 * | 9/2010 | Zhang et al. | 425/149 |
| 2010/0252188 A1 | 10/2010 | Inanami | |
| 2011/0236639 A1 * | 9/2011 | Saifullah et al. | 428/156 |
| 2011/0272838 A1 | 11/2011 | Malloy | |
| 2012/0074580 A1 * | 3/2012 | Nalla et al. | 257/774 |
| 2012/0128811 A1 * | 5/2012 | Shizawa et al. | 425/385 |
| 2013/0336005 A1 * | 12/2013 | Chen et al. | 362/611 |

OTHER PUBLICATIONS

Kumar A., and Whitesides G. M., 1993, "Features of gold having mircometer to centimeter dimensions can be formed through a combination of stamping with an elastomeric stamp and an alkanethiol "ink" followed by chemical etching," Applied Physics Letters, 63(14), p. 2002.

Decre M., Schneider R., Burdinski D., Schellekens J., Saalmink M., and Dona R., "Wave Printing (1): Towards Large-Area, Multilayer Microcontact Printing," Mat. Res. Soc. Symp. Proc. EXS-2, p. 59-61.

Delamarche E., Schmid H., Michel B., and Biebuyck H., 1997, "Stability of molded polydimethylsiloxane microstructures," Advanced Materials, 9(9), p. 741-746.

Bietsch A., and Michel B., "Conformal contact and pattern stability of stamps used for soft lithography," Journal of Applied Physics, 88(7), p. 4310.

Hui C. Y., Jagota A, Lin Y. Y., and Kramer E. J., 2002, "Constraints on Microcontact Printing Imposed by Stamp Deformation," Langmuir, 1 8(4), pp. 1394-1407.

Sharp K. G., Blackman G. S., Glassmaker N.J., Jagota A., and Hui C.-Y., 2004, "Effect of stamp deformation on the quality of microcontact printing: theory and experiment.," Langmuir : the ACS journal of surface and colloids, 20( 15), pp. 6430-6438.

Biebuyck H. A, Larsen N. B., Delamarche E., and Michel B. 1997, "Lithography beyond light: Microcontact printing with monolayer resists," IBM Journal of Research and Development, 41(1), pp. 159-170.

International Search Report and Written Opinion issued in Connection with International Patent Application No. PCT/US2012/063522 mailed May 10, 2013.

* cited by examiner

STAMP FOR MICROCONTACT PRINTING

This application claims priority to provisional patent application Ser. No. 61/559,203, filed Nov. 14, 2011. The contents of this provisional application are incorporated herein by reference in their entirety.

BACKGROUND OF THE INVENTION

This invention relates to microcontact printing and more particularly to an elastomeric stamp that provides improved process performance when very small (micrometer or nanometer) printing features are desired.

Microcontact printing is a lithographic method employing an elastomeric stamp and applicable to a variety of ink/substrate combinations [1-4]. After inking, applying, and removing the stamp, the resulting pattern can act as an etch resist, deposition catalyst, or as a final pattern itself. Most notably, applications include low-cost or flexible semiconductors, low-cost or flexible displays, advanced engineered surfaces, and the biological devices.

Dimensional inaccuracies in a stamp or substrate limit the feasible feature scales in microcontact printing; even infinitesimal variations in the stamp thickness have been shown to impact contact area, contact pressure and feature collapse.

A variety of stamping methods and machines [5-8] have been documented in the prior art. However, none of these machines, nor prior research investigations in stamp and pattern transfer integrity [9-12], have accounted for the sensitivity of the process to errors in stamp, substrate, or superstrate dimensions.

Traditional microcontact printing stamps are made of polydimethylsiloxane (PDMS) by casting the PDMS over a patterned surface, for example a wafer patterned with photoresist. This process results in a stamp with features imparted on one side, which is then mounted to a machine using the backside of the stamp or used in manual application. The incompressible elastomeric body of these stamps can develop significant contact pressure when compressed between printing plates or printing rolls. At micrometer scale displacements sufficient pressure develops to collapse the features on the stamp, destroying the intended transfer pattern.

The present invention enables accurate pattern transfer in situations in which pattern integrity would be compromised in traditional stamps.

SUMMARY OF THE INVENTION

In a first aspect the invention is a stamp for microcontact printing. The stamp includes a bulk portion having first and second surfaces. The first surface includes a pattern of features to be transferred and the second surface includes a different pattern of features. The features on the second surface have a lower stiffness than the features on the first surface. The features on the second surface allow the stamp to absorb more mechanical contact energy before the features on the first surface collapse. It is preferred that the features on the first surface be of micrometer or nanometer scale. It is also preferred that the features on the second surface are larger than the features on the first surface. The features on the second surface may be an order of magnitude or greater larger than the features on the first surface.

In a preferred embodiment, the bulk portion of the stamp has a stiffness larger than that of the features on the first and second surfaces. It is also contemplated that the features on the second surface form microchannels for delivering a substance to the stamp, such as ink. The microchannels may provide tailored damping.

In another aspect, the invention is a method for making a microcontact stamp. The method includes providing a mold having two opposing mold halves, one mold half including a rigid master providing a first pattern of features and the other mold half including a flexible master providing a second pattern of features. A polymer precursor is introduced into the mold and the polymer is solidified or cured to make the stamp. In a preferred embodiment, the polymer precursor is a curable elastomer. In a preferred embodiment, the polymer precursor is drawn through the mold by vacuum, pressure, or gravity. In one embodiment, the mold half including the rigid master creates a pattern to be transferred and the mold half including the flexible master creates a pattern of compliant features.

DESCRIPTION OF THE PREFERRED EMBODIMENT

Figure 1A:
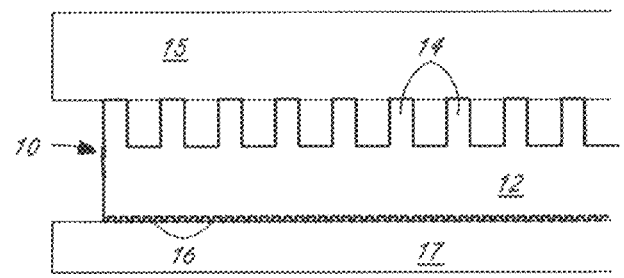
FIGS. 1a and 1b are cross-sectional schematic illustrations of an embodiment of the dual-sided stamp disclosed herein.
Figure 1B:
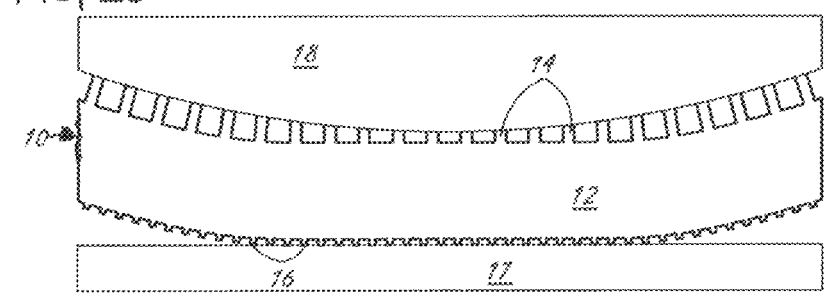

The invention disclosed herein is a microcontact printing stamp with features on both sides as shown in FIGS. 1a and 1b. A microcontact printing stamp 10 includes a bulk stamp portion 12, compliant features 14 and printing features 16. The stamp 10 is made of an elastomeric material such as PDMS. The compliant features 14 and the printing features 16 will now be described. The printing features 16 represent the pattern to be transferred. The pattern typically has micrometer or nanometer scale features. The compliant features 14 may have proportions similar to the pattern 16, but preferably at a scale much larger than the pattern 16. For example, if the printing features 16 are comprised of posts that are 1 micrometer wide and 1 micrometer tall, the compliance features 14 would be comprised of posts at least 10 micrometers wide and 10 micrometers tall, or even 100 micrometers wide and 100 micrometers tall. Because of this configuration, the features 14 have a much lower stiffness than the features 16 such that deformations will occur in the compliant features 14 rather than in the printing features 16.

Because of the dual-sided design disclosed herein, any deformation during stamp use will occur predominately in the compliant features 14 so that the printing features 16 do not distort significantly or collapse. The bulk stamp portion 12 has high stiffness relative to either set of features 14 or 16, and accurately controls the spatial distribution of the printing feature 16 independently of any sheer deformations imposed on the stamp 10.

The stamp 10 is preferably mounted to a rigid superstrate, which may be a flat or curved surface 15 for discrete stamping operations, or to a roll 18 for continuous operations. A pattern is transferred by bringing the printing features 16 into contact with a substrate 17 that may be a rigid substrate, a flexible substrate wrapped around a roll at a particular contact angle, or a flexible substrate positioned over a rigid backup roller or plate.

While the printing features 16 must meet the requirements of the pattern to be transferred, the compliant features 14 can be organized in useful ways. The features 14 may form microchannels for delivering ink to the stamp 10 which can diffuse through the stamp to the printing features 16. Further, the features 14 may form microchannels to provide tailored damping: deformation will force this viscous media to flow through the channels. The features 14 may form microchannels or pockets that can have a pressure or vacuum applied to them through a porous superstrate or a superstrate with holes. This pressure or vacuum may be applied uniformly or selectively, and may be applied in a predetermined manner or through active feedback control. This pressure or vacuum may be used to hold the stamp against a superstrate or to affect the contact pressure between the stamp and the substrate.

Figure 2A:
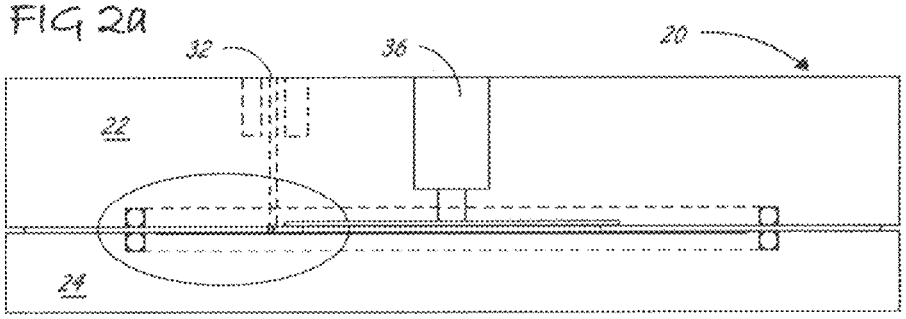
FIGS. 2a and 2b are cross-sectional views of a mold used in an embodiment of the method disclosed herein.

The method for casting stamps with features on both sides will now be described with reference to FIGS. 2a and 2b. A mold 20 includes an upper mold half 22 and a lower mold half 24. A spacer 26 separates the upper mold half 22 from the lower mold half 24. The stamp 10 can be cast with a rigid master pattern 28 providing one pattern and a flexible master 30 providing another pattern. Preferably, the rigid master 28 will be a patterned wafer and will impart printing features 16 to the first side of the stamp. Preferably, the flexible master 30 will be a pre-cast polymer master, which will impart the compliant features 14 to a second surface. The polymer master can be cast by existing methods, since it only requires features on one side. In an alternative embodiment, the flexible master 30 may be a thin sheet of patterned metal with low bending stiffness. Using one rigid master 28 and one flexible master 30 allows the flexible master 30 to be peeled from the stamp and then the stamp is peeled from the rigid master 28.

The masters are preferably held in the rigid mold 20 to control the thickness and planarity of the final stamp 10. A polymer precursor may be drawn through the mold by vacuum, pressure, or gravity. Preferably, the polymer precursor is drawn through the mold by vacuum to prevent formation of gas bubbles in the final stamp 10.

Returning to FIGS. 2a and 2b, the mold halves 22 and 24 are assembled around the spacer 26 to provide a particular stamp thickness; tire spacer 26 is sealed to the mold halves by seals. Fluid flows through an inlet port 32 through a channel in the spacer 26 to stamp cavity 34 when vacuum is applied to an outlet port (not shown). Inlet port 32 is preferably a monolithic nipple to minimize bubble entrapment. A pressure port 36 allows applying a vacuum to hold the flexible master 30 in place, or applying pressure to aid parting of the flexible master from the mold half. After disassembly, the masters and stamp are disassembled in a top-down fashion: first the flexible master 30 is removed then the stamp 10 is removed from the rigid master 28.

In roll-based configurations a common problem is mounting a stamp onto a printing roll. Often, in the prior art, a stamp is cast with a metallic film on its backside, which both stiffens the soft elastomeric stamp against in-plane deformations and allows mounting on a magnetic roller. This prior art method will not work for stamps which must have feature patterns imparted to both surfaces.

Figure 2B:
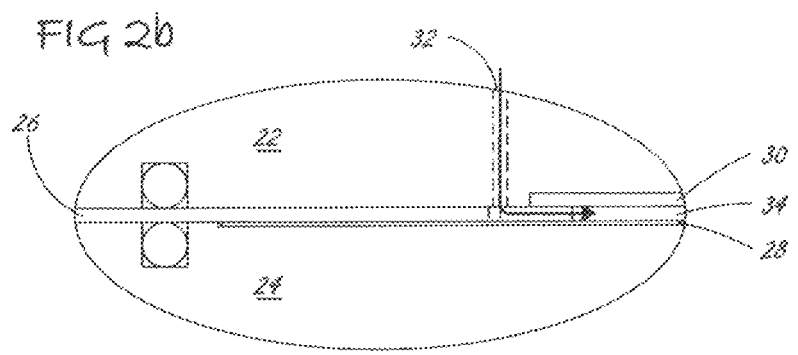

The stamp 10 can be mounted on a rigid printing roll at the same time that it is peeled from the rigid master 28, as shown in FIG. 2b. In this manner, the pattern can be easily aligned to a roll and actively transferred. One method of bonding the stamp to the roll is through application of vacuum through a porous roll to pockets created by the compliance features 14. A second method of bonding the stamp to the roll is by plasma treating stamp 10 surface and bonding it to a glass roll. A third method of bonding the stamp is through use of an adhesive, preferably cyanoacrylate. These methods permit nearly instantaneous bonding of the stamp to the roll so that the rigid master 28 and the roll can be mounted in a machine to simultaneously and accurately rotate the roll and translate the roll or substrate to minimize spatial errors in the printing features 16. The use of a machine to mount the stamp permits application of feedback control so that the seam in the roll-mounted stamp can be tightly controlled on the microscale or nanoscale so that continuous rolling can be performed.

Research has shown that the bulk stamp portion 12 has very high stiffness due to the incompressible elastomeric material of which it is made, such that any dimensional errors are compensated for by deformation in the stamp features. In the prior art, when the dimensional errors are on the order of the feature size, the features will collapse, leading to loss of pattern fidelity. While prior art microcontact printing has been demonstrated, with feature sizes as small as 30 nm [13], this collapse phenomenon represents a practical limit on feature sizes. The features can be no smaller than the precision of the roll, stamp and substrate.

The dual-face stamp 10 design disclosed herein provides an alternative location for dimensional errors to be absorbed. Rather than distorting the printing feature 16, any dimensional errors will cause the compliant features 14 to deform due to their relatively low stiffness. This deformation enables printing with feature sizes well below the threshold of macroscale dimensional errors, making microcontact printing a more robust production process.

The ability to incorporate microchannels or pockets in the compliant features 14 provides a level of process flexibility that no other stamp design affords.

The stamp 10 of the invention is of a monolithic design in which dimensions can be more carefully controlled if ink is to be diffused through the stamp to the printing surface, it is free to do so since the present design does not utilize a backing sheet that would block ink diffusion. When the stamp is mounted directly to a roll from the wafer, the spatial feature distribution remains controlled by the master wafer surface until it is directly transferred to the roll, thereby replacing the need for a stiff backing sheet. If a machine is used to mount the stamp that employs feedback control, the elastomeric stamp 10 can be infinitesimally stretched or compressed along the roll to exactly eliminate the stamp seam.

The present invention is an enabling design and manufacturing method that makes microcontact printing feasible for micrometer or smaller features in manufacturing environments. The stamp design of the invention makes some micron features possible on a more repeatable basis that is less sensitive to transverse dimensional deviations. The present invention may have application in the manufacture of displays and for flexible electronics. The stamp 10 of the invention may also be used for making engineered surfaces wherein particular micrometer or nanometer scale patterns can greatly increase heat transfer rates, charge capture, fouling properties or condensation behavior. These applications have widespread applications including conventional power generation, energy storage, desalination and solar-powered technologies.

The numbers in square brackets refer to the references listed herein. The contents of all of these references are incorporated herein by reference in their entirety.

It is recognized that modifications and variations of the invention disclosed herein will be apparent to those of ordinary skill in the art and it is intended that all such modifications and variations be included within the scope of the appended claims.

REFERENCES

[1] Xia Y., and Whitesides G. M., 1998, "Soft Lithography," Angewandte Chemie International Edition, 371 (5), pp. 550-575.
[2] Kumar A., Biebuyck H. A., and Whitesides G. M., 1994, "Patterning Self-Assembled Monolayers; Applications in Materials Science," Langmuir, (10), pp. 1498-1511.
[3] Kumar A., Biebuyck H., Abbott N., and Whitesides G. M., 1992, "The use of self-assembled monolayers and a selective etch to generate patterned gold features," Journal of the American Chemical Society, 114, pp. 9188-9189.
[4] Kumar A., and Whitesides G. M., 1993, "Features of gold having micrometer to centimeter dimensions can be formed through a combination of stamping with an elastomeric stamp and an alkanethiol '"ink"' followed by chemical etching," Applied Physics Letters, 63 (14), p. 2002.
[5] Kendale A. M., and Trumper D. L., "Microcontact printing," U.S. Pat. No. 7,117,790.
[6] Decre M., Schneider R., Burdinski D., Schellekens J., Saalmink M., and Dona R., 2004, "Wave Printing (1): Towards Large-Area, Multilayer Microcontact Printing," Mat. Res. Soc. Symp. Proc. EXS-2, p. 59-61.
[7] Bao Z., Makhjita A., and Rogers J. A., 2004, "High-resolution method for patterning a substrate with microprinting," U.S. Pat. No. 6,736,985.
[8] Cracauer R. F., Ganske R., Goh M. C., Goh J. B., Liederman A. B., Loo R., and Tam P., 2006, "Method and apparatus for micro-contact printing," U.S. Pat. No. 6,981,445.
[9] Delamarche E., Schmid H., Michel B., and Biebuyck H., 1997, "Stability of molded polydimethylsiloxane microstructures," Advanced Materials, 9 (9), p. 741-746.
[10] Bietsch A., and Michel B., 2000, "Conformal contact and pattern stability of stamps used for soft lithography," Journal of Applied Physics, 88 (7), p. 4310.
[11] Hui C. Y., Jagota a, Lin Y. Y., and Kramer E. J., 2002, "Constraints on Microcontact Printing Imposed by Stamp Deformation," Langmuir, 18 (4), pp. 1394-1407.
[12] Sharp K. G., Blackman G. S., Glassmaker N. J., Jagota A., and Hui C.-Y., 2004, "Effect of stamp deformation on the quality of microcontact printing: theory and experiment," Langmuir: the ACS journal of surfaces and colloids, 20 (15), pp. 6430-8.
[13] Biebuyck G. S., Larsen N. B., Delamarche E., and Michel B., 1997, "Lithography beyond light: Microcontact printing with monolayer resists," IBM Journal of Research and Development, 41 (1), pp. 159-170.
[14] Hougham G., Fryer P., Nunes R., and Rothwell M. B., 2002, "Process of fabricating a precision microcontact printing stamp," U.S. Pat. No. 6,656,308.
[15] Hougham G., Fryer P., Nunes R., and Rothwell M. B., 2002, "Process of fabricating a precision microcontact printing stamp," U.S. Pat. No. 6,783,717.

What is claimed is:

1. Stamp for microcontact printing comprising:
an elastomeric bulk portion having first and second surfaces, the first and second surfaces being on opposite sides of the bulk portion; the first surface including a pattern of raised features to be transferred; and the second surface comprising pattern of compliant raised features; wherein the compliant raised features on the second surface have a lower stiffness than features on the first surface so that deformation during use of stamp occur predominantly in the second surface having the lower stiffness compliant raised features rather than in the first surface having the raised features to be transferred; and wherein the features on the second surface form microchannels for delivering a substance to the first surface; wherein the microchannel provide tailored damping.

2. The stamp of claim 1 wherein the features on the first surface are micrometer or nanometer scale.

3. The stamp of claim 1 wherein the features on the second surface are larger than the features on the first surface.

4. The stamp of claim 3 wherein the features on the second surface are an order of magnitude larger than the features on the first surface.

5. The stamp of claim 3 wherein the features on the second surface are at the scale of micrometers.

6. The stamp of claim 1 wherein the bulk portion has a stiffness larger than the stiffness of the features on the first and second surfaces.

* * * * *